US006650591B2

United States Patent
Owa

(10) Patent No.: US 6,650,591 B2
(45) Date of Patent: Nov. 18, 2003

(54) NONVOLATILE SEMICONDUCTOR MEMORY DEVICE

(75) Inventor: Yoshihito Owa, Hakushu-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/153,611

(22) Filed: May 24, 2002

(65) Prior Publication Data

US 2002/0191441 A1 Dec. 19, 2002

(30) Foreign Application Priority Data

May 31, 2001 (JP) ........................... 2001-165449

(51) Int. Cl.[7] .............................................. G11C 16/04
(52) U.S. Cl. .......................... 365/230.03; 365/185.05; 365/185.16; 365/185.14
(58) Field of Search ........................ 365/230.03, 185.05, 365/185.16, 185.26, 185.14

(56) References Cited

U.S. PATENT DOCUMENTS

| | | | |
|---|---|---|---|
| 5,408,115 A | 4/1995 | Chang .......................... 257/324 |
| 5,412,600 A | * 5/1995 | Nakajima ............... 365/185.17 |
| 5,414,693 A | * 5/1995 | Ma et al. .................. 365/185.1 |
| 5,422,504 A | 6/1995 | Chang et al. ............... 257/316 |
| 5,494,838 A | 2/1996 | Chang et al. .................. 437/43 |
| 5,963,465 A | 10/1999 | Eitan ........................... 365/63 |
| 5,969,383 A | 10/1999 | Chang et al. ............... 257/316 |
| 6,151,248 A | * 11/2000 | Harari et al. ........... 365/185.14 |
| 6,177,318 B1 | 1/2001 | Ogura et al. ................. 438/267 |
| 6,248,633 B1 | 6/2001 | Ogura et al. ................. 438/267 |
| 6,255,166 B1 | 7/2001 | Ogura et al. ................. 438/257 |
| 2002/0181267 A1 | 12/2002 | Owa .......................... 365/63 |
| 2002/0191453 A1 | 12/2002 | Owa .......................... 365/200 |
| 2003/0002343 A1 | 1/2003 | Kanai et al. ............ 365/185.28 |
| 2003/0002344 A1 | 1/2003 | Kanai et al. ............ 365/185.28 |
| 2003/0021167 A1 | 1/2003 | Kamei ......................... 365/200 |
| 2003/0072191 A1 | 4/2003 | Kamei ......................... 365/200 |

FOREIGN PATENT DOCUMENTS

| JP | A 7-161851 | 6/1995 |
|---|---|---|
| JP | B1 2978477 | 11/1999 |
| JP | A 2001-156188 | 6/2001 |

OTHER PUBLICATIONS

Hayashi et al., "Twin MONOS Cell with Dual Control Gates", 2000, IEEE VLSI Technology Digest.
Chang et al., "A New SONOS Memory Using Source–Side Injection for Programming", IEEE Electron Device Letters, vol. 19, No. 7, Jul. 1998, pp. 253–255.
Chen et al. A Novel Flash Memory Device with S Plit Gate Source Side Injection and ONO Charge Storage Stack (SPIN), 1997, VLSI Technology Digest, pp. 63–64.

* cited by examiner

Primary Examiner—Michael S. Lebentritt
Assistant Examiner—Jung H. Hur
(74) Attorney, Agent, or Firm—Oliff & Berridge, PLC

(57) ABSTRACT

A nonvolatile semiconductor memory device has a plurality of memory cells arranged in first and second directions, each of the memory cells having two MONOS memory cells controlled by one word gate and two control gates. A memory cell array region has a plurality of control gate lines formed by connecting, in the first direction, control gates of the memory cells in each column arranged in the first direction, and sub control gate lines extending in the first direction in an upper layer of the plurality of control gate lines, the number of the sub control gate lines being half the number of the control gate lines. Each two control gate lines adjacent across the boundaries between the plurality of memory cells in the second direction are connected in common with one sub control gate line.

16 Claims, 13 Drawing Sheets

NONVOLATILE SEMICONDUCTOR MEMORY DEVICE

Japanese Patent Application No. 2001-165449, filed on May 31, 2001, is hereby incorporated by reference in its entirety.

BACKGROUND OF THE INVENTION

The present invention relates to a nonvolatile semiconductor memory device including memory cells, each having two nonvolatile memory elements controlled by one word gate and two control gates.

As one type of nonvolatile semiconductor memory device, a MONOS (Metal-Oxide-Nitride-Oxide-Semiconductor or Metal-Oxide-Nitride-Oxide-Substrate) device is known. In the MONOS nonvolatile semiconductor memory device, a gate insulating layer between a channel and a gate is formed of a laminate consisting of a silicon oxide film, silicon nitride film, and silicon oxide film. Charges are trapped in the silicon nitride film.

The MONOS nonvolatile semiconductor memory device is disclosed in literature (Y. Hayashi, et al., 2000 Symposium on VLSI Technology Digest of Technical Papers, pp. 122–123). This literature discloses a twin MONOS flash memory cell including two nonvolatile memory elements (MONOS memory cells) controlled by one word gate and two control gates. Specifically, one flash memory cell has two charge trap sites.

In order to drive the twin MONOS flash memory cell, two bit lines, one word line, and two control gate lines are necessary.

Of these interconnects, two bit lines and two control gate lines are generally wired in the column direction. However, it is difficult to provide four interconnects (two bit lines and two control gate lines) within the width of a plurality of memory cells in one column using the same metal interconnect layer even in the case of using a photolithographic process with a minimum line & space width.

Therefore, the wiring space must be secured by increasing the width of the memory cells in one column. However, this causes a decrease in the degree of integration of the memory cells, whereby it is impossible to deal with a recent increase in the capacity of the nonvolatile semiconductor memory device.

BRIEF SUMMARY OF THE INVENTION

The present invention may provide a highly integrated nonvolatile semiconductor memory device in which one memory cell has two trap sites.

The present invention may also provide a nonvolatile semiconductor memory device capable of securing the degree of margin and freedom relating to the arrangement of interconnects by decreasing the number of interconnects for supplying electric power to control gates.

Further, the present invention may provide a nonvolatile semiconductor memory device capable of securing the degree of margin and freedom relating to the arrangement of interconnects for the control gates and bit lines.

A nonvolatile semiconductor memory device according to one aspect of the present invention comprises a memory cell array region in which a plurality of memory cells are arranged in first and second directions intersecting each other, each of the memory cells having two nonvolatile memory elements and being controlled by one word gate and two control gates. The memory cell array region includes a plurality of control gate lines formed by connecting, in the first direction, each of the control gates of the memory cells in each column arranged in the first direction, and sub control gate lines extending in the first direction in an upper layer of the plurality of control gate lines, the number of sub control gate lines being half the number of control gate lines. Each two control gate lines adjacent across the boundaries between the plurality of memory cells in the second direction are connected in common with one sub control gate line.

In this aspect of the present invention, the number of the sub control gates can be decreased to approximately half the number of the control gates. This produces a surplus of space for interconnects in a layer in which the sub control gate lines are disposed, whereby the degree of freedom for the interconnects can be increased.

Therefore, there is no need to decrease the degree of integration in order to secure space for metal interconnects even if one memory cell has two trap sites, whereby a highly integrated nonvolatile semiconductor memory device can be provided.

The nonvolatile semiconductor memory device may further comprise a select region disposed adjacent to the memory cell array region in the first direction, and a plurality of main control gate lines extending in the first direction within the select region and the memory cell array region, the number of the main control gate lines being smaller than the number of the sub control gate lines. This select region may have at least one sub control gate select circuit which selectively connects the sub control gate lines with the main control gate lines.

Since this enables the number of the main control gate lines to be smaller than the number of the sub control gate lines, a surplus of space for interconnects is produced in a layer in which the main control gate lines are disposed, whereby the degree of freedom for interconnects can be increased.

The select region may include first and second select regions disposed on both sides of the memory cell array region in the first direction. In this case, a first sub control gate select circuit which selectively connects one of an odd-numbered sub control gate line and an even-numbered sub control gate line with the plurality of main control gate lines may be provided in the first select region. A second sub control gate select circuit which selectively connects the other one of the odd-numbered sub control gate line and the even-numbered sub control gate line with the plurality of main control gate lines may be provided in the second select region.

The degree of freedom for interconnects of the sub control gate lines is further increased by dividing the select region, to which the plurality of sub control gate lines extends, in two.

In a nonvolatile semiconductor memory device according to another aspect of the present invention, the memory cell array region comprises sub control gate lines extending in the first direction in an upper layer of the plurality of control gate lines, the number of sub control gate lines being the same as the number of bit lines, and a plurality of word lines extending in the second direction. In this case, each two control gate lines adjacent across the boundaries between the plurality of memory cells in the second direction are connected in common with one sub control gate line.

According to this aspect of the present invention, the number of the sub control gate lines is the same as the number of the bit lines. Therefore, the width of the line and space can be designed in common between a layer in which the bit lines are formed and a layer in which the sub control gate lines are formed.

Each two control gate lines, disposed on both sides of an even-numbered sub bit line, may be connected in common with an even-numbered sub control gate line. Each two control gate lines, disposed on both sides of an odd-numbered sub bit line, may be connected in common with an odd-numbered sub control gate line.

Each of the bit lines may be divided into a plurality of bit split lines in the first direction by a discontinuous region. In this case, a plurality of sub bit lines connected respectively with the plurality of bit split lines which form one bit line may be provided. With this configuration, the bit lines divided in the first direction can be backed with the sub bit lines.

The nonvolatile semiconductor memory device may further comprise first and second select regions formed on both sides of the memory cell array region in the first direction, a plurality of main control gate lines extending in the first direction within the first and second select regions and the memory cell array region, the number of the main control gate lines being smaller than the number of the sub control gate lines, and a plurality of main bit lines extending in the first direction within the first and second select regions and the memory cell array region, the number of the main bit lines being smaller than the number of the sub bit lines.

This enables the number of main bit lines and the number of main control gate lines to be decreased, whereby a surplus of space for interconnects is produced because the total number of the interconnects decreases even if the main bit lines and the main control gate lines are disposed in the same layer.

Specifically, the main bit lines and the main control gate lines may be a third metal interconnect layer, for example.

Moreover, the degree of freedom for each interconnects is further increased by dividing the select region, to which the sub bit lines and the sub control gate lines extend, in two.

In this case, the first select region may comprise a first sub bit select circuit which selectively connects one of the odd-numbered sub bit line and the even-numbered sub bit line with the main bit lines, and a first sub control gate select circuit which selectively connects one of the odd-numbered sub control gate line and the even-numbered sub control gate line with the main control gate lines. The second select region may comprise a second sub bit select circuit which selectively connects the other one of the odd-numbered sub bit line and the even-numbered sub bit line with the main bit lines, and a second sub control gate select circuit which selectively connects the other one of the odd-numbered sub control gate line and the even-numbered sub control gate line with the main control gate lines.

Since the sub bit select circuits and the sub control gate select circuits can be dispersed in the first and second select regions in this manner, the circuit layout is facilitated.

A plurality of memory blocks each of which is formed of the memory cell array region and the first and second select regions provided on both sides of the memory cell array region may be arranged in the first direction. This enables an increase in the storage capacity of the nonvolatile semiconductor memory device. Moreover, since the length of the sub control gate lines and the sub bit lines can be decreased, an interconnect capacitance can be reduced. Furthermore, since data can be collectively erased in the block unit, the erase unit can be reduced in comparison with the case of erasing data over the entire memory.

In this case, a main bit line driver which drives the plurality of main bit lines may be provided on one end of the arranged memory blocks in the first direction.

This enables the plurality of main bit lines to be shared by the plurality of memory blocks, and the main bit line driver to be shared by the plurality of memory blocks.

A main control gate line driver which drives the plurality of main control gate lines may be provided on the other end of the arranged memory blocks in the first direction.

This enables the plurality of main control gate lines to be shared by the plurality of memory blocks, and the main control gate line driver to be shared by the plurality of memory blocks.

A word line driver which drives the word lines may be provided on one end of the arranged memory blocks in the second direction. In order to further increase the storage capacity of the nonvolatile semiconductor memory device, the plurality of memory blocks may be disposed on both sides in the second direction with the word line driver interposed therebetween.

Each of the two nonvolatile memory elements may have an ONO film consisting of an oxide film (O), nitride film (N), and oxide film (O) as a charge trap site. However, other types of structures may be employed.

DETAILED DESCRIPTION OF THE EMBODIMENT

An embodiment of the present invention is described below with reference to the drawings.

Structure of Memory Cell

Figure 1:
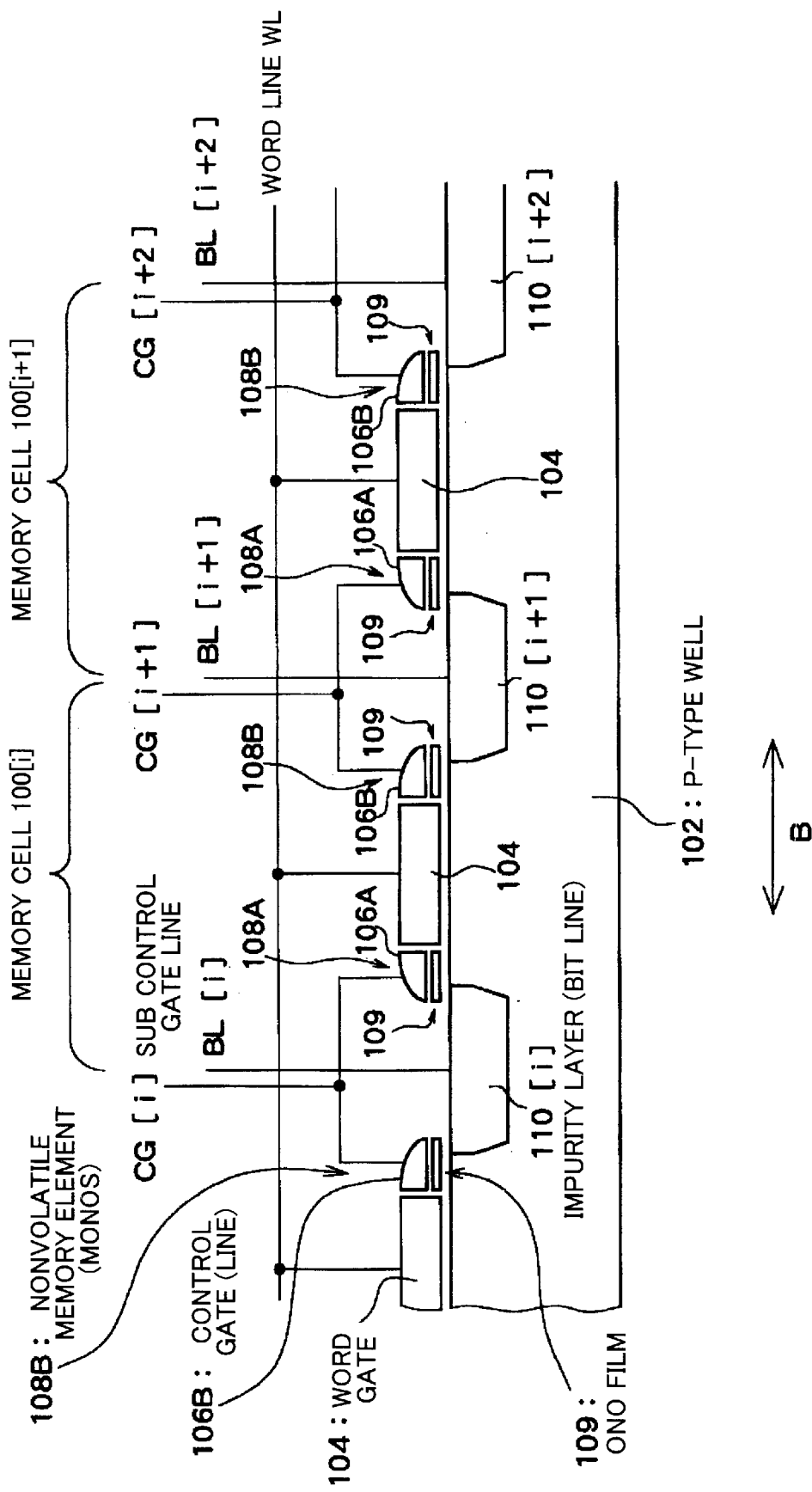
FIG. 1 is a cross-sectional view showing memory cells used in a nonvolatile semiconductor memory device according to one embodiment of the present invention.
Figure 2:
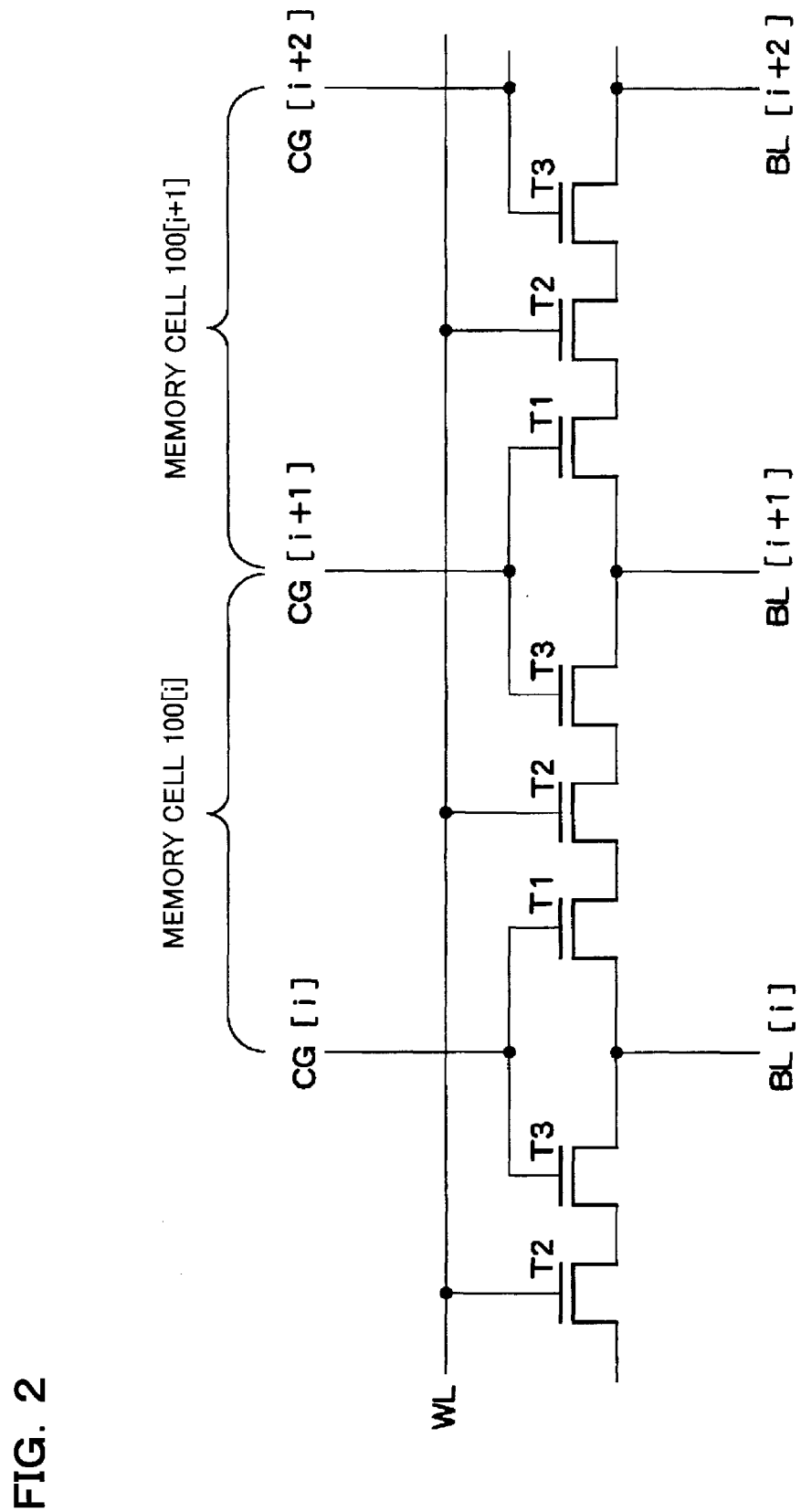
FIG. 2 is an equivalent circuit diagram of the memory cells shown in FIG. 1.

FIG. 1 is a view showing a cross section of a nonvolatile semiconductor memory device. FIG. 2 is an equivalent circuit diagram of the nonvolatile semiconductor memory device. In FIG. 1, one memory cell 100 includes a word gate 104 formed of a material containing polysilicon or the like on a P-type well region 102 on a silicon substrate through a gate oxide film, two control gates 106A and 106B, and two memory elements (MONOS memory cells) 108A and 108B.

The control gates 106A and 106B are formed on opposite sidewalls of the word gate 104. The control gates 106A and 106B are electrically insulated from the word gate 104.

Each of the memory elements 108A and 108B is formed by layering an oxide film (O), nitride film (N), and oxide film (O) between either the control gate 106A or 106B corresponding to M (Metal) in the MONOS and the P-type well 102 corresponding to S (Silicon) in the MONOS. The control gates 106A and 106B may be formed using a conductive material such as doped silicon or silicide.

Therefore, one memory cell 100 includes two MONOS memory cells 108A and 108B, each having a split gate (control gates 106A and 106B). One word gate 104 is shared by the MONOS memory cells 108A and 108B.

The MONOS memory cells 108A and 108B function as charge trap sites. Each of the MONOS memory cells 108A and 108B can trap charges in the ONO film 109.

As shown in FIGS. 1 and 2, a plurality of word gates 104 arranged at intervals in the row direction (second direction B in FIGS. 1 and 2) is connected in common with one word line WL formed of a polycide or the like.

The control gates 106A and 106B shown in FIG. 1 extend in the column direction (first direction A perpendicular to the surface of FIG. 1), and are shared by a plurality of memory cells 100 arranged in the column direction. Therefore, the control gates 106A and 106B may be referred to as control gate lines.

A sub control gate line CG [i+1] consisting of a second metal layer formed in an upper layer of the control gate lines is connected with the control gate line 106B in the [i] th memory cell 100 [i] and the control gate line 106A in the [i+1] st memory cell 100 [i+1].

An [i+1]st impurity layer 110 [i+1] shared by the MONOS memory cell 108B in the [i] th memory cell 100 [i] and the MONOS memory cell 108A in the [i+1] st memory cell 100 [i+1] is formed in the P-type well 102.

The impurity layers 110 [i], [i+1] and [i+2] are formed in the P-type well, and function as bit lines which extend in the column direction (first direction A perpendicular to the surface of FIG. 1) and are shared by a plurality of memory cells 100 arranged in the column direction, for example. The impurity layers 110 [i], [i+1], and [i+2]. Therefore, the impurity layers 110 [i], [i+1], [i+2], and the like may be referred to as the bit lines.

Sub bit lines BL [i], [i+1], and [i+2] formed of a first metal layer, for example, are connected with the impurity layers (bit lines) 110 [i], [i+1], and [i+2].

Data Read Operation from Memory Cell

As shown in FIG. 2, a transistor T2 driven by the word gate 104 and transistors T1 and T3 respectively driven by the control gates 106A and 106B are connected in series in one memory cell 100.

Figure 3:
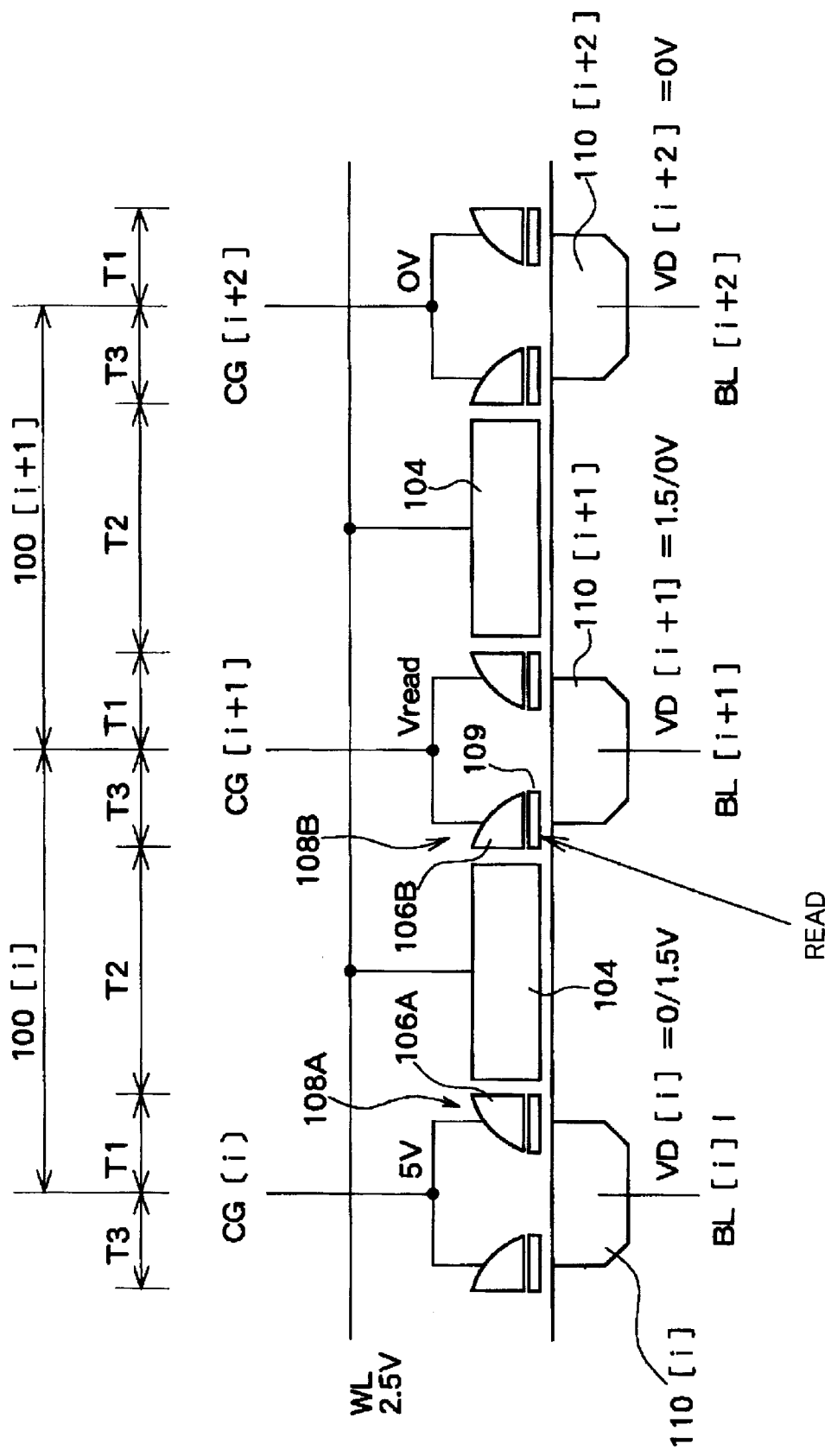
FIG. 3 is a schematic explanatory diagram for describing a data read operation of the nonvolatile semiconductor memory device shown in FIG. 1.

Setting of the potential at each point of two adjacent memory cells 100 [i] and [i+1] is described below with reference to FIG. 3. FIG. 3 is a view for describing reading of data from the MONOS memory cell 108B on the right of the word gate 104 in the memory cell 100 [i]. The following description of the operation is given on the assumption that the threshold voltage of the transistors T1–T3 is less than 2.5 V.

Each of the transistors T2 is turned ON by applying 2.5 V to each of the word gates 104, for example. The transistor T1 corresponding to the MONOS memory cell 108A is turned ON by applying an override voltage (5 V, for example) to the control gate 106A on the left side of the memory cell 100 [i] through the sub control gate line CG [i]. A read potential Vread is applied as a potential VCG of the control gate 106B on the right side of the memory cell 100 [i].

The operation of the transistor T3 corresponding to the MONOS memory cell 108B differs as described below depending upon whether or not charges are stored in the MONOS memory cell 108B on the right of the word gate 104.

Figure 4:
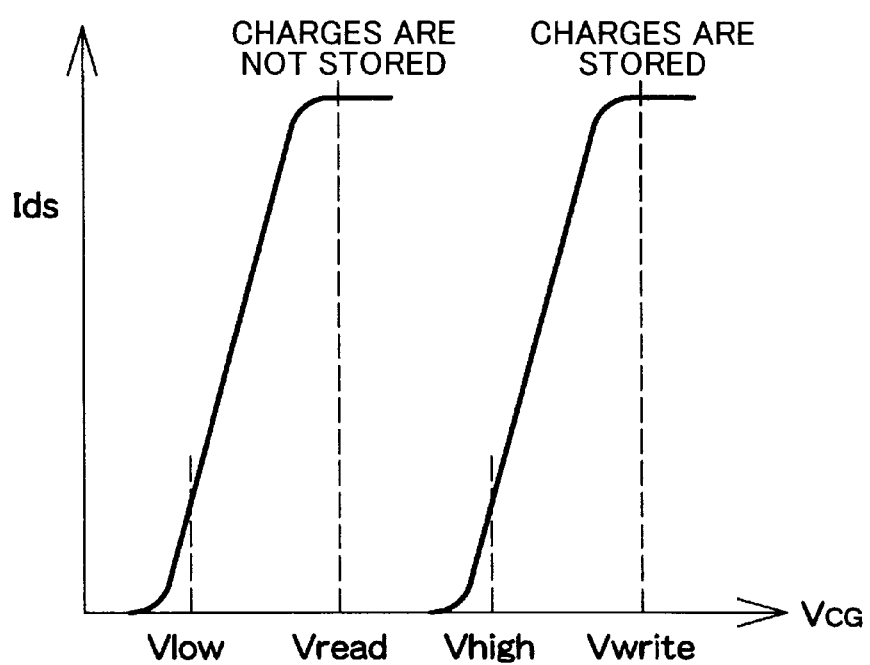
FIG. 4 is a characteristic diagram showing a relation between a control gate voltage VCG and a source-drain current Ids in the memory cells shown in FIG. 1.

FIG. 4 shows the relation between a voltage applied to the control gate 106B on the right side of the memory cell 100 [i] and a current Ids which flows between the source and drain of the transistor T3 corresponding to the MONOS memory cell 108B controlled by this voltage.

As shown in FIG. 4, in the case where charges are not stored in the MONOS memory cell 108B, the current Ids starts to flow when the control gate potential VCG exceeds a lower threshold voltage Vlow. In the case where charges are stored in the MONOS memory cell 108B, the current Ids does not start to flow unless the control gate potential VCG exceeds a higher threshold voltage Vhigh.

The voltage Vread applied to the control gate 106B at the time of reading data is set to approximately an intermediate voltage (2.5 V, for example) between the two threshold voltages Vlow and Vhigh.

Therefore, the current Ids flows if charges are not stored in the MONOS memory cell 108B, and the current Ids does not flow if charges are stored in the MONOS memory cell 108B.

At the time of reading data, the impurity layer 110 [i] (bit line [i]) is connected to a sense amplifier and a potential VD [i+1] of the impurity layer 110 [i+1] (bit line [i+1]) is set to 1.5 V. This allows the current Ids to flow when charges are not stored in the MONOS memory cell 108B, whereby a current of 25 $\mu$A or more flows through the sub bit line BL [i] through the transistors T1 and T2 in an ON state, for example. Since the current Ids does not flow when charges are stored in the MONOS memory cell 108B, current flowing through the sub bit line BL [i] is less than 10 nA even if the transistors T1 and T2 are in an ON state, for example. Therefore, data can be read from the MONOS memory element 108B (selected cell) in the twin memory cell 100 [i] by detecting the current flowing through the sub bit line BL [i] using the sense amplifier.

The transistors T1 and T2 are turned ON in the memory cell 100 [i+1]. However, since the control gate potential VCG of the transistor T3 is set to 0 V, which is lower than the threshold voltages Vlow and Vhigh shown in FIG. 3, the source-drain current does not flow in the memory cell 100 [i+1]. Therefore, data storage conditions in the memory cell 100 [i+1] do not adversely affect the reading of data from the memory cell 100 [i].

In the case of reading data from the MONOS memory cell 108A on the left side of the memory cell 100 [i], the potential at each point of the memory cell 100 [i−1] and [i] is set in the same manner as described above.

Programming of Memory Cell

Figure 5:
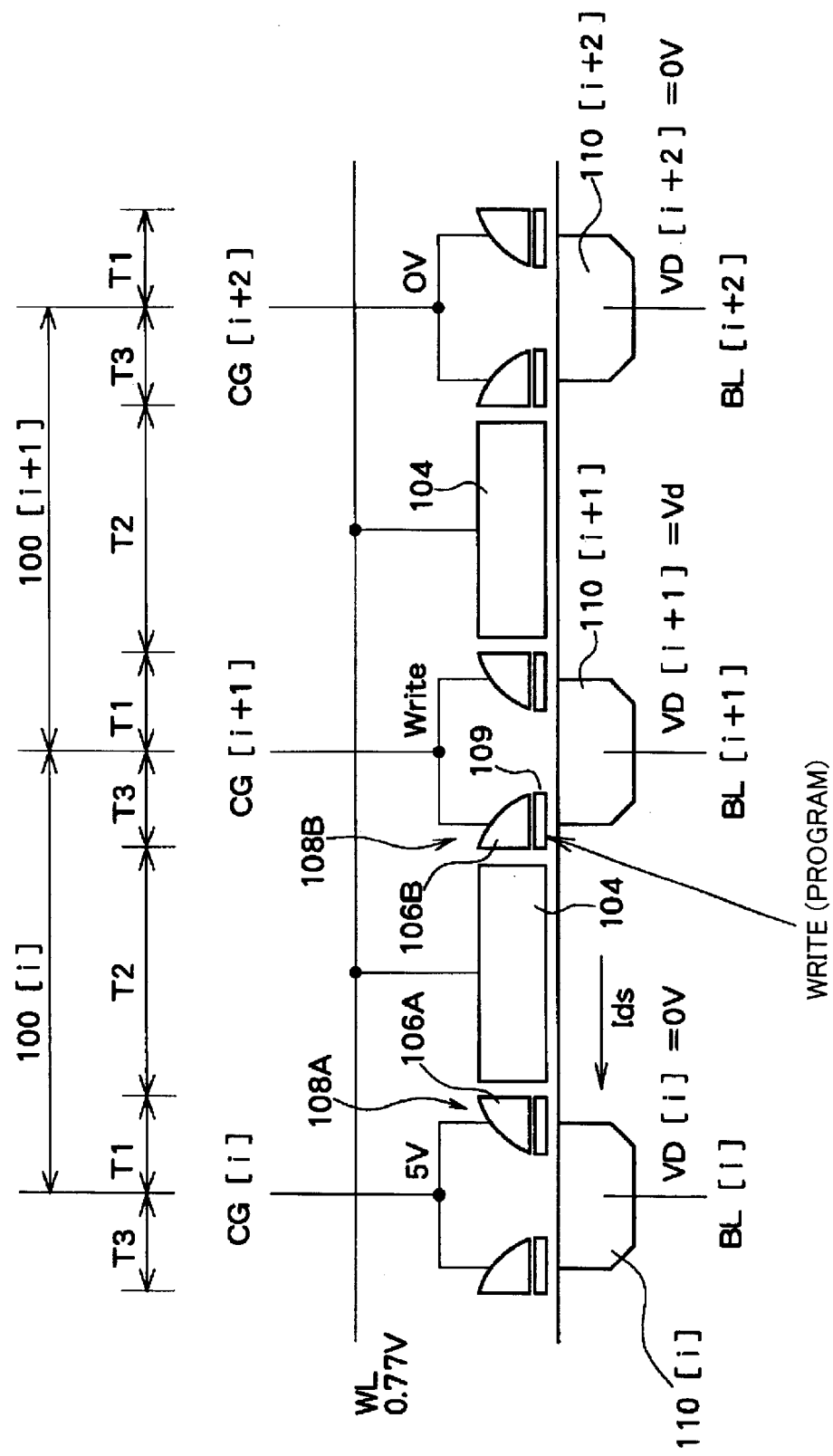
FIG. 5 is a schematic explanatory diagram for describing a data write (program) operation of the nonvolatile semiconductor memory device shown in FIG. 1.

FIG. 5 is a view for describing data programming of the MONOS memory cell 108B on the right of the word gate 104 in the memory cell 100 [i]. A data erase operation described later has been performed before this data program operation.

In FIG. 5, the potential of the sub control gate line CG [i] is set to the override potential (5 V, for example), and the potential of the sub control gate line CG [i+2] is set to 0 V in the same manner as shown in FIG. 3. However, the potential of each word gate 104 is set to about 0.77–1 V by the word line WL, for example. The potential of the control gate 108B on the right side of the memory cell 100 [i] is set to the write potential Vwrite (5–6 V, for example) shown in FIG. 4, through the sub control gate line CG [i+1]. The potential VD [i+1] of the [i+1]st impurity layer 110 [i+1] (bit line [i+1]) is set to 4.5–5 V through the sub bit line BL[i+1], for example.

This causes the transistors T1 and T2 in the memory cell 100 [i] to be turned ON, whereby the current Ids flows toward the impurity layer 110 [i] and channel hot electrons (CHE) are trapped in the ONO film 109 of the MONOS memory cell 108B. The program operation of the MONOS memory cell 108B is performed in this manner, whereby data "0" or "1" is written in.

Data Erase of Memory Cell

Figure 6:
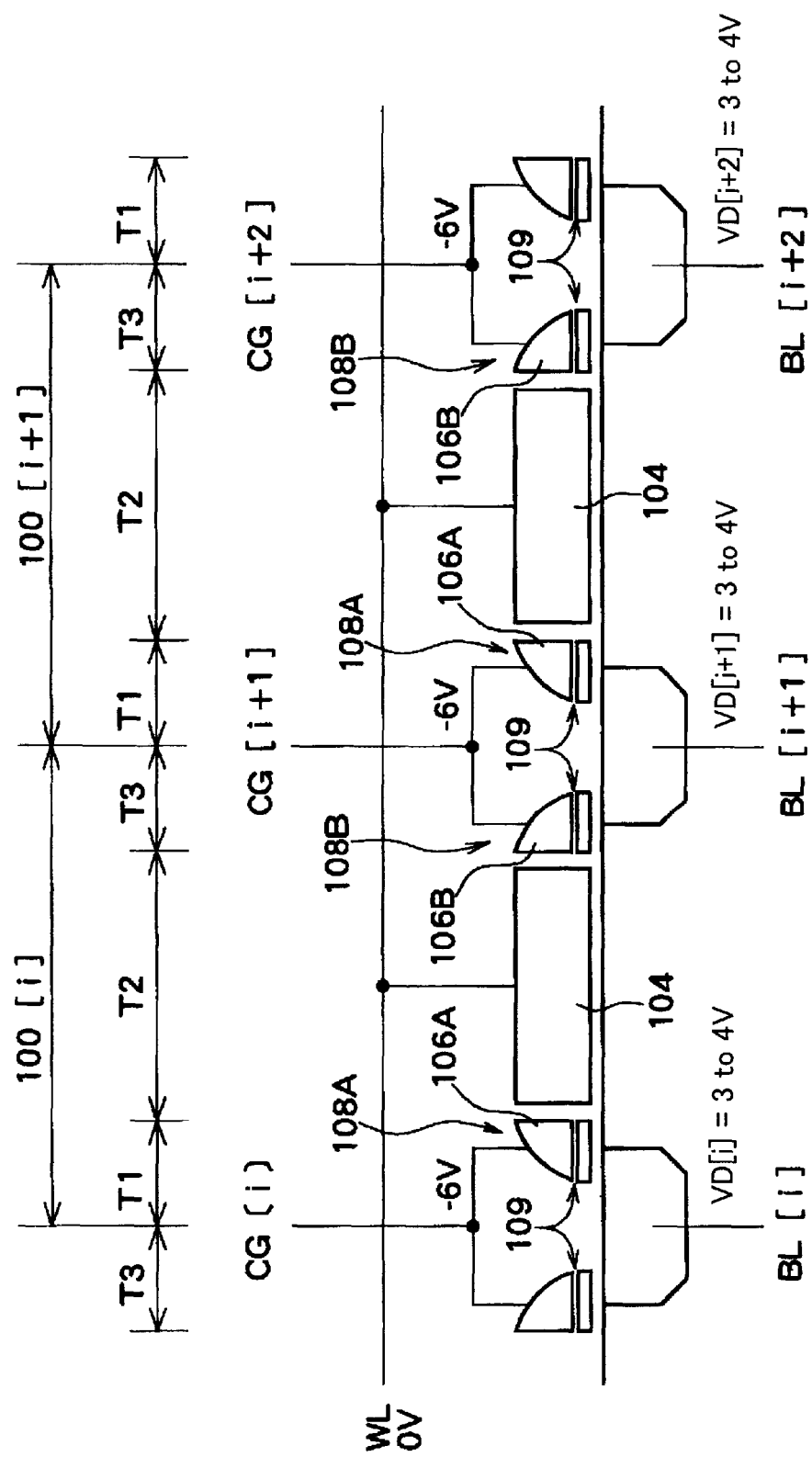
FIG. 6 is a schematic explanatory diagram for describing a data erase operation of the nonvolatile semiconductor memory device shown in FIG. 1.

FIG. 6 is a view for describing data erase of the memory cells 100 [i] and [i+1] connected to the word line WL.

In FIG. 6, the potential of each word gate 104 is set to 0 V by the word line WL. The potential of the control gates 106A and 106B is set to about −5 to −6 V by the sub control gate lines CG [i], [i+1], and [i+2], for example. The potential of the impurity layers (bit lines) 110 [i], [i+1], and [i+2] is set to 3–4 V (equal to the potential of the P-type well) by the sub bit lines BL [i], [i+1], and [i+2].

This causes electrons trapped in the ONO films 109 of the MONOS memory cells 108A and 108B to be extracted and erased by a tunnel effect caused by an electric field formed by −5 to −6 V being applied to the metal (M) and 3–4 V being applied to the silicon (S). This enables data to be erased in a plurality of memory cells at the same time. Differing from the above example, the stored electrons may be erased by forming hot holes using band—band tunneling on the surface of the impurity layers which become the bit lines.

Entire Configuration of Nonvolatile Semiconductor Memory Device

The nonvolatile semiconductor memory device formed by using the above-described memory cells 100 is described below with reference to FIGS. 7 and 8.

Figure 7:
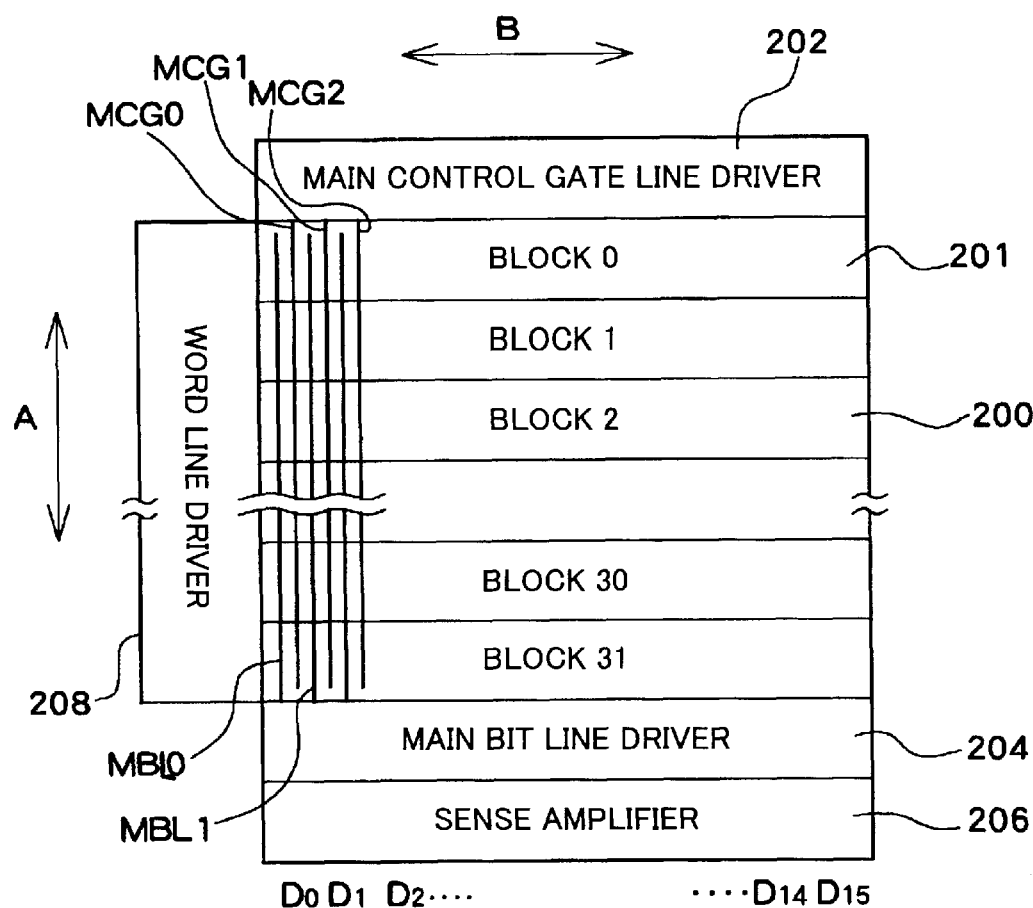
FIG. 7 is a view showing a planar layout of the entire nonvolatile semiconductor memory device shown in FIG. 1.

FIG. 7 is a view showing a planar layout of the nonvolatile semiconductor memory device. A memory region 200 is divided into 32 memory blocks 201, for example. A main control gate line driver 202 is formed on one end of the memory region 200 in the first direction A. A main bit line driver 204 and a sense amplifier 206 are formed on the other end in the first direction A. A word line driver 208 is formed on one end of the memory region 200 in the second direction B.

The main control gate line driver 202 drives main control gate lines MCG0, MCG1, . . . formed of a third metal interconnect layer extending in the first direction A across the memory blocks 201 (blocks No. 0 to No. 31), for example.

The main bit line driver 204 drives main bit lines MBL0, MBL1, . . . formed of the third metal interconnect layer extending in the first direction A across the memory blocks 201 (blocks No. 0 to No. 31), for example.

Figure 8:
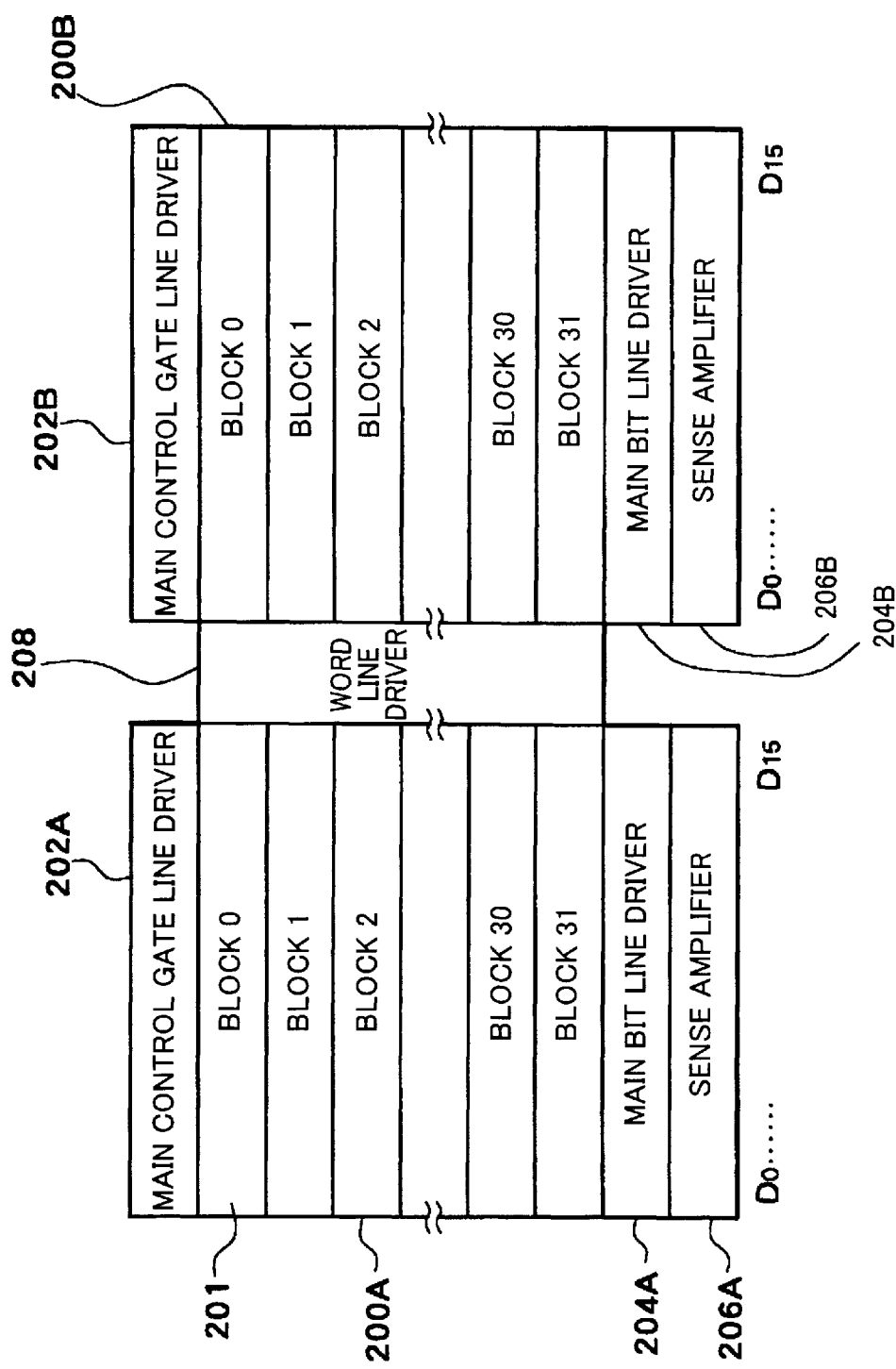
FIG. 8 is a view showing another example of the planar layout of the entire nonvolatile semiconductor memory device shown in FIG. 1.

FIG. 8 is a view showing a nonvolatile semiconductor memory device having two memory regions 200A and 200B. A main control gate line driver 202A, a main bit line driver 204A, and a sense amplifier 206A are formed in the memory region 200A. A main control gate line driver 202B, a main bit line driver 204B, and a sense amplifier 206B are formed in the memory region 200B. The word line driver 208 is disposed between the memory regions 200A and 200B and shared by the memory regions 200A and 200B.

The layout of the nonvolatile semiconductor memory device is not limited to those shown in FIGS. 7 and 8. Various types of modifications are possible. In the case where the storage capacity of the memory region 200 is 16 Mbits, for example, the storage capacity of the nonvolatile semiconductor memory device having four memory regions 200 is 64 (16×4) Mbits.

In each of the memory blocks 201 formed by dividing the memory region 200 having a storage capacity of 16 Mbits into 32 sections, 2 k (4 kbit) memory cells 100 are connected to one word line WL. 128 word lines WL are disposed in each memory block. Therefore, each memory block 201 has a storage capacity of 32 kwords (64 kbytes). In each of the memory regions 200 (200A and 200B) shown in FIGS. 7 and 8, 16-bit data can be read or written at the same time through output terminals D0–D15 (each one bit).

Configuration of Memory Block

The configuration of one memory block 201 formed by dividing the memory region 200 into 32 sections, for example, is described below with reference to FIG. 9.

Figure 9:
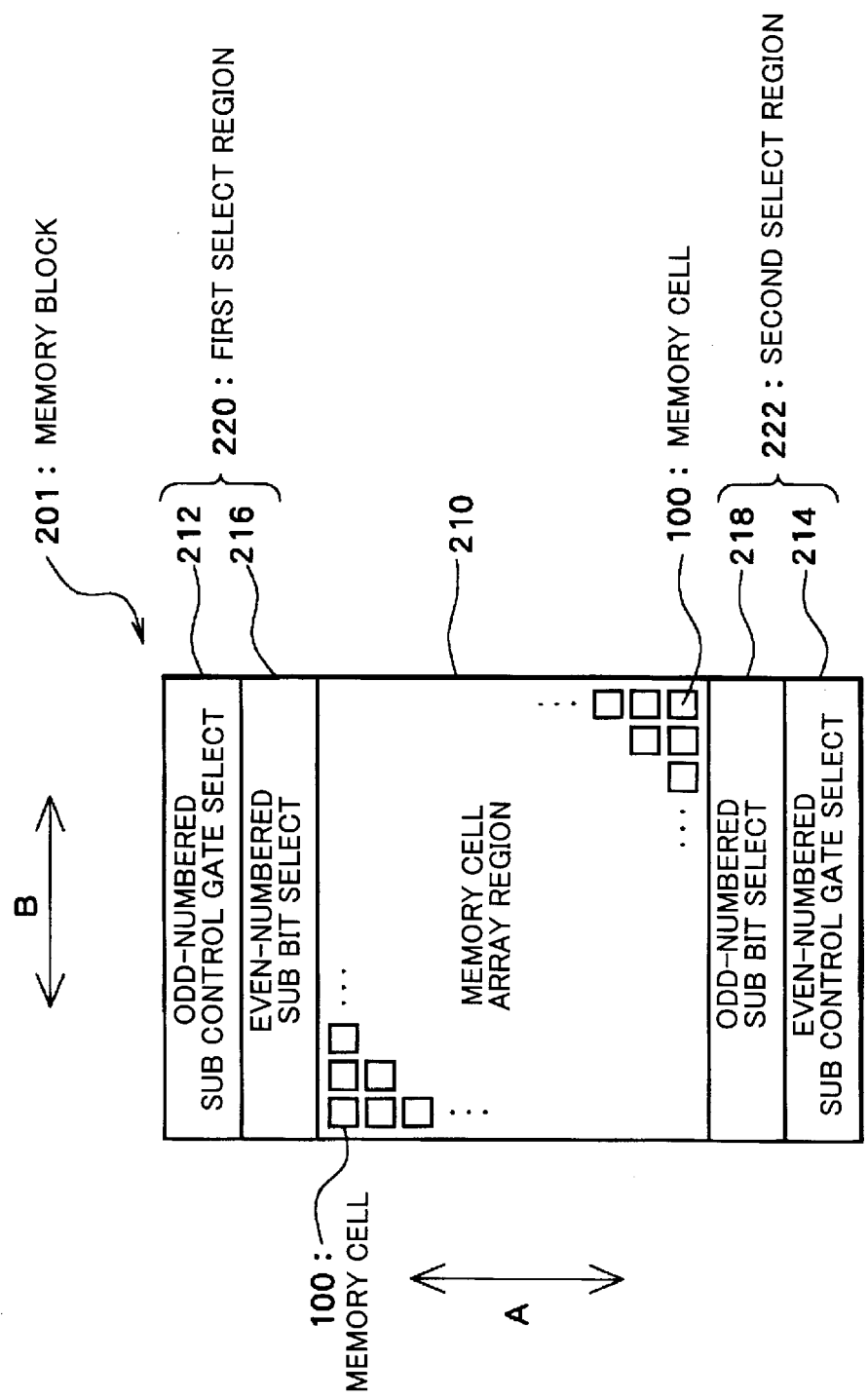
FIG. 9 is a schematic explanatory diagram showing a memory block shown in FIGS. 7 or 8.

FIG. 9 is a view showing a planar layout of one memory block 201 shown in FIGS. 7 and 8. In FIG. 9, the memory block 201 includes a memory cell array region 210 in which a plurality of memory cells 100 is arranged in the first and second directions A and B which intersect each other. A first select region 220 and a second select region 222 are formed on opposite sides of the memory cell array region in the first direction A. The first select region 220 is divided into an odd-numbered sub control gate select circuit 212 and an even-numbered sub bit select circuit 216. The second select region 222 is divided into an even-numbered sub control gate select circuit 214 and an odd-numbered sub bit select circuit 218.

FIGS. 10 to 13 are views showing the details of the memory cell array region 210 in the memory block 201. In FIGS. 10 to 13, 256 word lines WL0–WL255 extending in the second direction B are formed in the memory cell array region 210, for example. The word lines WL0–WL255 are formed of a polycide or the like.

Figure 10:
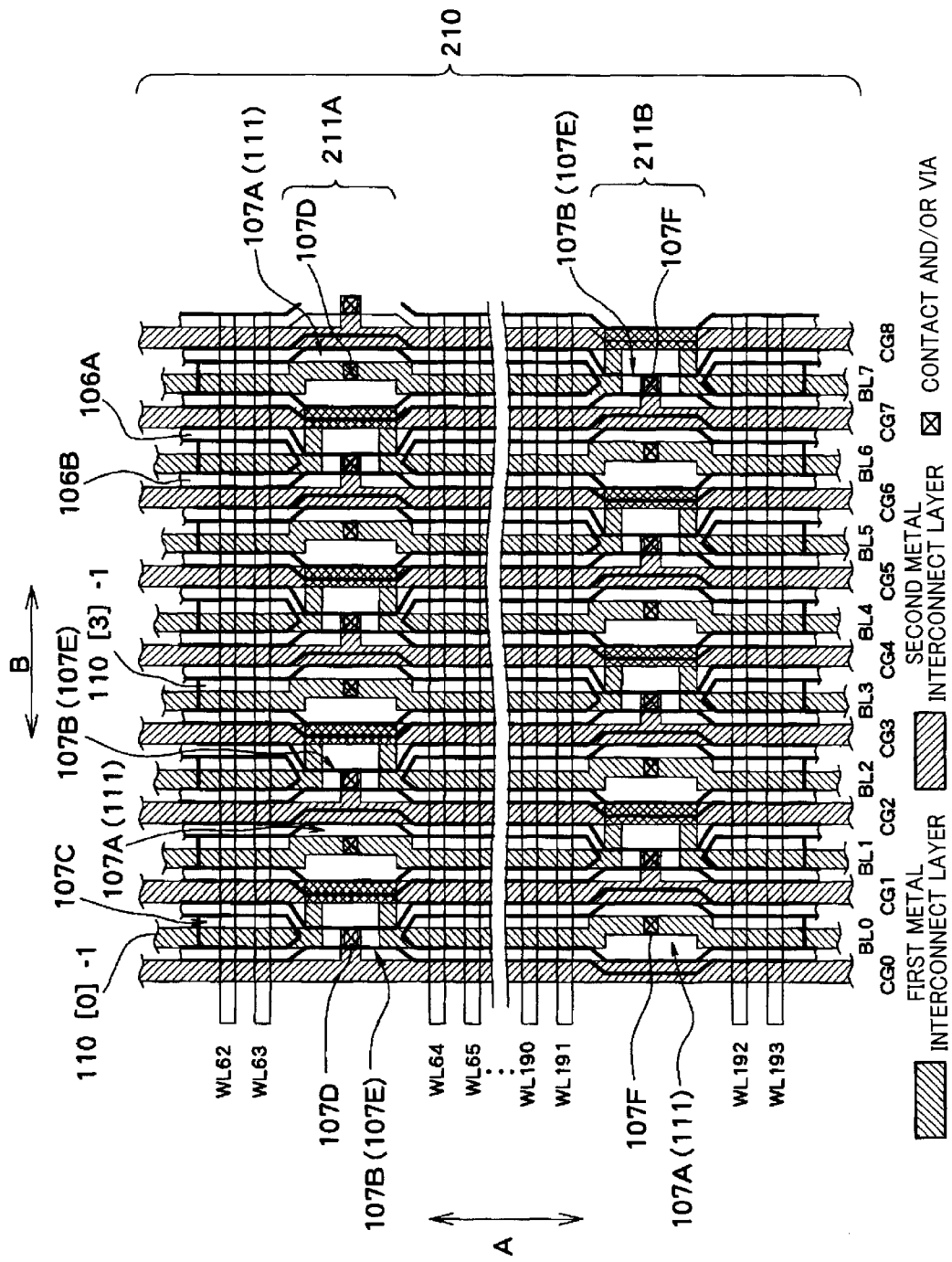
FIG. 10 is a wiring diagram of a memory cell array region in the memory block shown in FIG. 9.

The control gate lines 106A and 106B are disposed on opposite sides of each of the sub bit lines BL0, BL1, . . . , as shown in FIG. 10. Therefore, the total number of the control gate lines 106A and 106B is approximately twice the total number of the sub bit lines BL0, BL1, . . .

Figure 12:
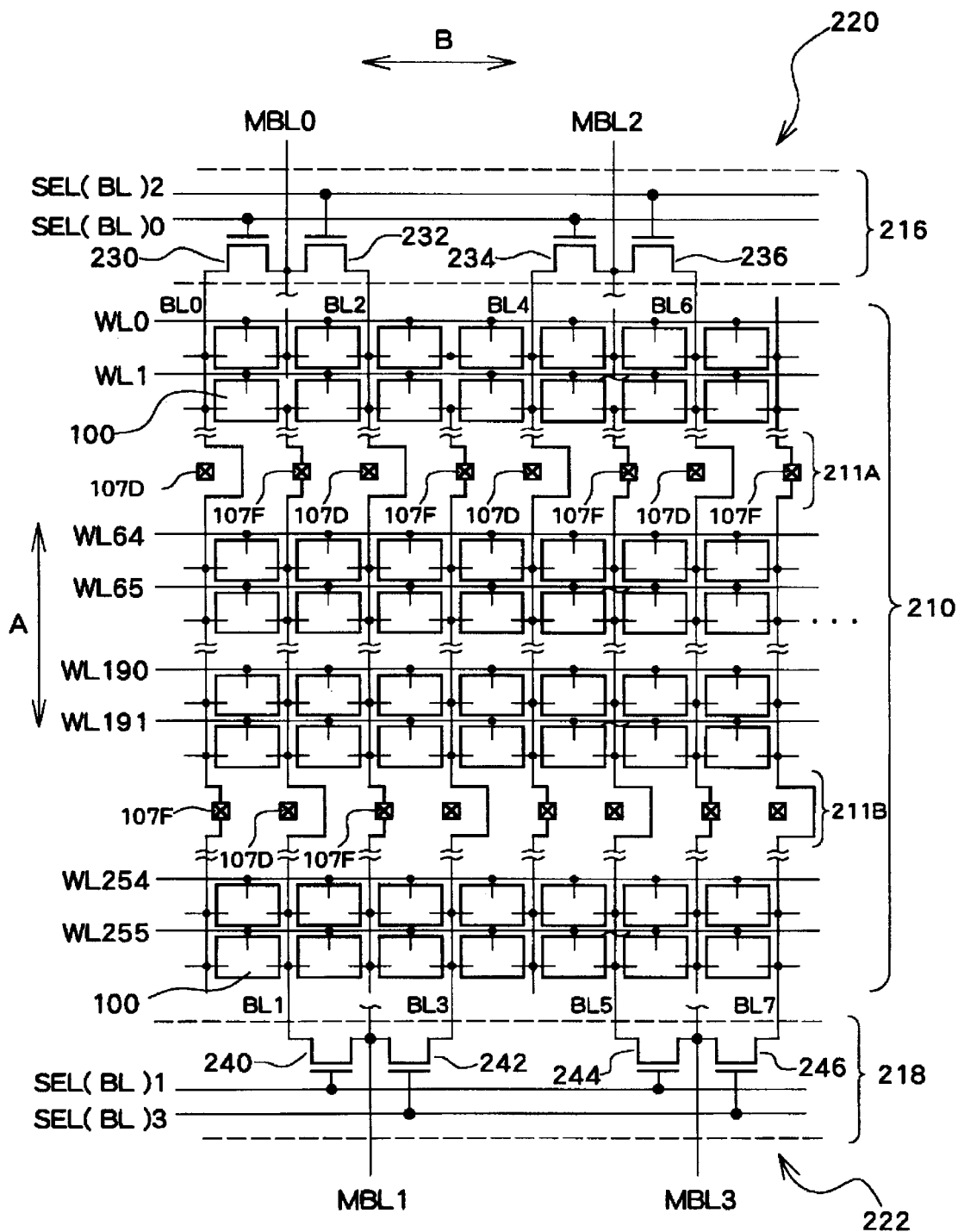
FIG. 12 is a wiring diagram showing a relation between sub bit lines and main bit lines in the memory cell array shown in FIG. 10.

In FIG. 12, the even-numbered sub bit lines BL0, BL2, BL4, . . . extend to the even-numbered sub bit select circuit 216 in the first select region 220 disposed on one end in the first direction A. The odd-numbered sub bit lines BL1, BL3, BL5, extend to the odd-numbered sub bit select circuit 218 in the second select region 222 disposed on the other end in the first direction A.

Figure 13:
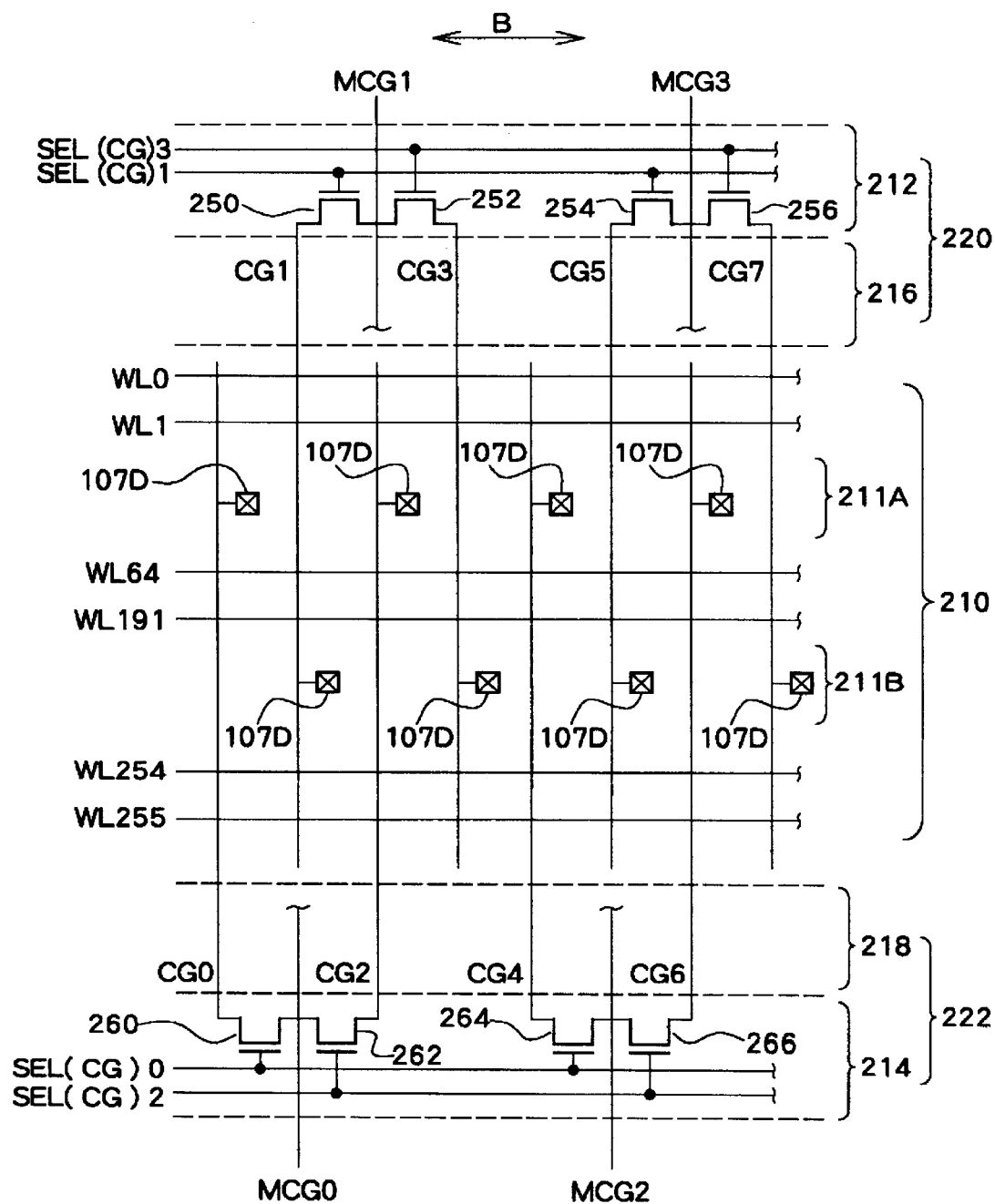
FIG. 13 is a wiring diagram showing a relation between sub control gate lines and main control gate lines in the memory cell array shown in FIG. 10.

The even-numbered sub control gate lines CG0, CG2, extend to the even-numbered sub control gate select circuit 214 in the second select region 222, as shown in FIG. 13. The odd-numbered sub control gate lines CG1, CG3, . . . extend to the odd-numbered sub control gate select circuit 212 in the first select region 220, as shown in FIG. 13.

The even-numbered sub bit select circuit 216 formed in the first select region 220 includes transistors 230 and 232 which selectively connect either the even-numbered sub bit line BL0 or the even-numbered sub bit line BL2 with the main bit line MBL0, which is the third metal interconnect layer, based on the potential of the select signal lines SEL(BL)0 and SEL(BL)2, as shown in FIG. 12. Transistors 234 and 236 connect either the even-numbered sub bit line BL4 or the even-numbered sub bit line BL6 with the main bit line MBL2.

The odd-numbered sub bit select circuit 218 formed in the second select region 222 includes transistors 240 and 242 which selectively connect either the odd-numbered sub bit line BL1 or the odd-numbered sub bit line BL3 with the main bit line MBL1, which is the third metal interconnect layer, based on the potential of the select signal lines SEL(BL)1 and SEL(BL)3, as shown in FIG. 12. Transistors 244 and 246 connect either the odd-numbered sub bit line BL5 or the odd-numbered sub bit line BL7 with the main bit line MBL3.

The odd-numbered sub control gate select circuit 212 formed in the first select region 220 includes transistors 250 and 252 which selectively connect either the odd-numbered sub control gate line CG1 or the odd-numbered sub control gate line CG3 with the main control gate line MCG1, which is the third metal interconnect layer, based on the potential of the select signal lines SEL(CG)1 and SEL(CG)3, as shown in FIG. 13. Transistors 254 and 256 connect either the odd-numbered sub control gate line CG5 or the odd-numbered sub control gate line CG7 with the main control gate line MCG3.

The even-numbered sub control gate select circuit 214 formed in the second select region 222 includes transistors 260 and 262 which selectively connect either the even-numbered sub control gate line CG0 or the even-numbered sub control gate line CG2 with the main control gate line MCG0, which is the third metal interconnect layer, based on the potential of the select signal lines SEL(CG)0 and SEL(CG)2, as shown in FIG. 13. Transistors 264 and 266 connect either the even-numbered sub control gate line CG4 or the even-numbered sub control gate line CG6 with the main control gate line MCG2.

The above-described data read, write (program), and erase operations of the memory cells 100 can be performed by changing the main-sub connection using the respective odd-numbered and even-numbered sub control gate select circuits 212 and 214 and the respective odd-numbered and even-numbered sub bit select circuits 216 and 218 while driving the main control gate line MCG and the main bit line MBL using the main control gate line driver 202 and main bit line driver 204.

In FIG. 12, the select signal line SEL(BL)0 is connected in common with the gates of the transistors 230 and 234. However, two select signal lines SEL(BL) may be used. Other select signal lines SEL(BL)1 to SEL(BL)3 and select signal lines SEL(CG)0 to SEL(CG)3 shown in FIG. 13 may also be divided into two select signal lines.

Wiring Layout

Figure 11:
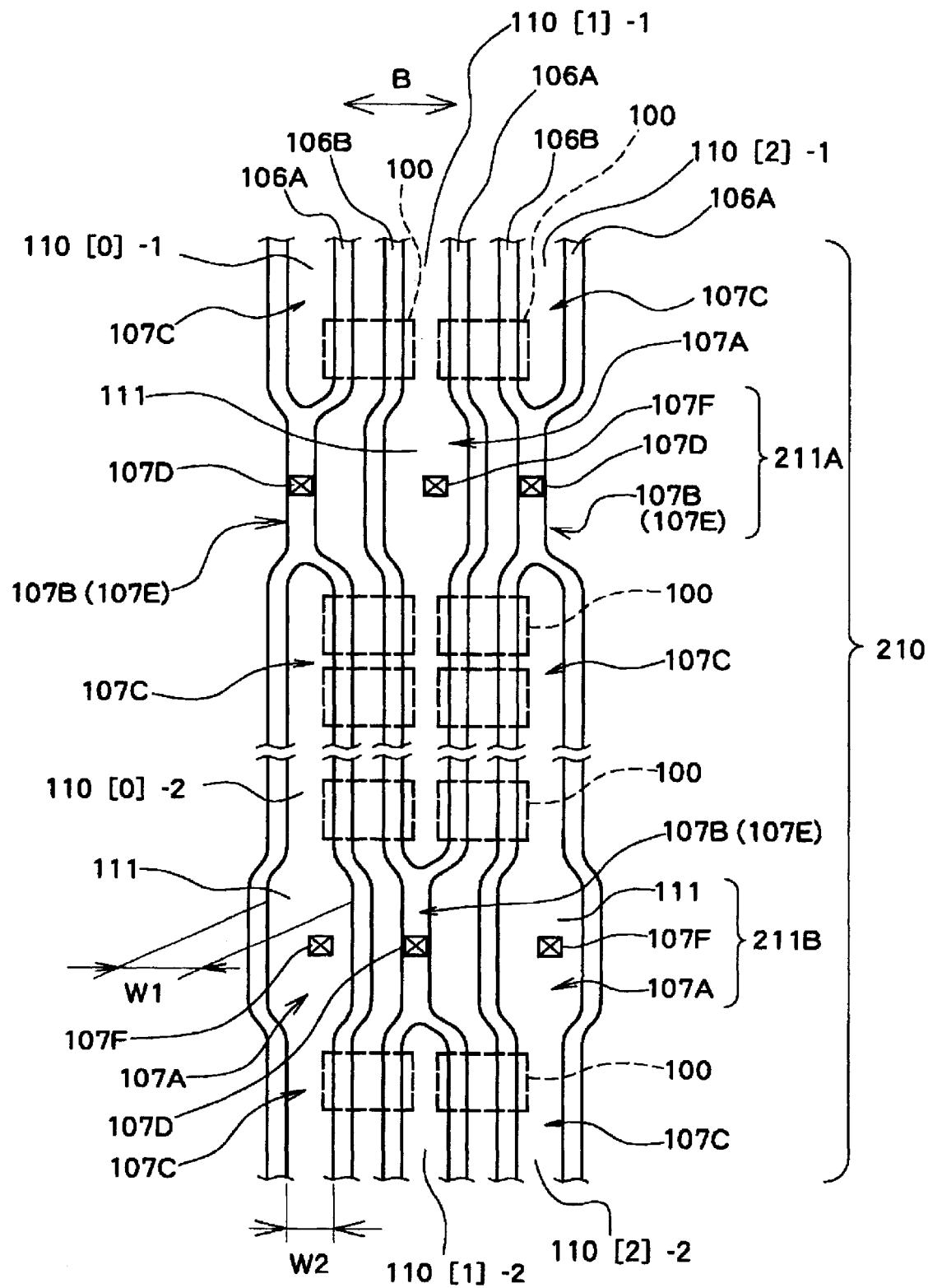
FIG. 11 is a wiring diagram showing an example of a wiring layout of bit lines and control gate lines in the memory cell array region shown in FIG. 10.

As shown in FIG. 11, each two control gate lines 106B and 106A adjacent in the second direction B across the boundaries between a plurality of memory cells 100 have a wide spacing region 107A having a large line-to-line width of W1, a common connection region 107B in which the two lines are connected in common in one line, and a narrow spacing region 107C having a small line-to-line width of W2, which is disposed in a region other than the wide spacing region 107A and the common connection region 107B.

Each two control gate lines 106B and 106A adjacent in the second direction B across the boundaries between a plurality of memory cells 100 are connected with each of the sub control gate lines CG0, CG1, CG2, CG3, . . . through a connection section 107D formed in the common connection region 107B (see FIGS. 10 and 11).

The sub control gate lines CG0, CG1, CG2, CG3, . . . connected with each two control gate lines 106B and 106A consist of the second metal interconnect layer. Therefore, a contact which connects the common connection region 107B with the first metal interconnect layer, the island-like first metal interconnect layer, and a via which connects the first metal interconnect layer with the sub control gate line are formed in the connection section 107D.

The bit line 110 [0] is divided into a plurality of sections by a discontinuous region 107E which faces the common connection region 107B in the vertical direction. In FIG. 11, two bit split lines 110 [0]-1 and 110 [0]-2 are illustrated. The bit split lines 110 [0]-1 and 110 [0]-2 are formed of the impurity layers. In order to decrease the resistance of the bit split lines, a silicide may be formed on the surface of the impurity layers. The bit split lines 110 [0]-1 and 110 [0]-2 which make up one bit line 110 [0] are connected with one sub bit line BL0.

The bit split line 110 [0]-2 has a line width expanding region 111 in which the line width is increased from the width W2 to the width W1 in a region which faces the wide spacing region 107A in the vertical direction. The bit split line 110 [0]-2 is connected with the sub bit line BL0 through a contact 107F formed in the line width expanding region 111. The bit split line 110 [0]-1 is connected with the sub bit line BL through the contact 107F (not shown) formed in the line width expanding region 111 (not shown) disposed outside the region in which the memory cells 100 are formed.

Since the bit lines 110 [0]-1 and 110 [0]-2 divided into a plurality of sections (two, for example) are backed by the sub bit line BL0 extending in the first direction A, the potential of the bit lines 110 [0]-1 and 110 [0]-2 can be set to the same value.

The above-described structure of the bit line 110 [0] and the connection with the sub bit line BL0 are also applied to other bit lines 100 [1], 100 [2], 100 [3]. . .

As shown in FIG. 11, the wide spacing regions 107A are disposed in the second direction B, one on each side of the common connection region 107B.

First and second wiring-only regions 211A and 211B are formed in the memory cell array region 210 at an interval in the first direction A (see FIGS. 10 to 13). As shown in FIG. 10, the wide spacing regions 107A of each two control gate lines connected to the odd-numbered sub control gate lines CG1, CG3, CG5, CG7, . . . , and the common connection regions 107B of each two control gate lines connected to the even-numbered sub control gate lines CG0, CG2, CG4, CG6, . . . are formed in the first wiring-only region 211A.

The wide spacing regions 107A of each two control gate lines connected to the even-numbered sub control gate lines CG0, CG2, CG4, CG6, . . . , and the common connection regions 107B of each two control gate lines connected to the odd-numbered sub control gate lines CG1, CG3, CG5, CG7, . . . are formed in the second wiring-only region 211B.

As shown in FIGS. 10 and 11, the connection section 107D connected to the sub control gate line CG and the contact 107F connected to the sub bit line BL adjacent to the sub control gate line CG are present almost in a single line extending in the first direction A. Because of this, the sub bit line BL is formed to detour to the right to avoid the connection section 107D in the first wiring-only region 211A or the second wiring-only region 211B, as shown in FIGS. 10 and 12.

The sub control gate CG is formed to detour to the right to a small extent at a position adjacent to the position at which the sub bit line BL is formed to detour to the right in order to secure the space between the sub control gate CG and the sub bit line BL. This is because the common connection region 107B is formed at a position shifted to the right from the center between two control gate lines 106B and 106A in FIG. 10. If the common connection region 107B is formed midway between two control gate lines 106B and 106A, it is unnecessary to have the sub control gate line CG make a detour.

The reason why the wide spacing regions 107A are disposed in the second direction B, one on each side of the common connection region 107B as shown in FIG. 11 is describe below.

Specifically, in the second wiring-only region 211B in which the contacts 107F are formed for the even-numbered bit split lines 110 [0]-2 and 110 [2]-2, the width of the bit split lines must be increased from the width W2 to the width W1 in order to secure the connection region with the contacts 107F. If the odd-numbered bit line 110 [1] is formed between the line width expanding regions 111 of the even-numbered bit split lines 110 [0]-2 and 110 [2]-2, the pitch of the bit lines must be increased. This hinders an increase in the degree of integration of the memory cells.

Therefore, the discontinuous region 107E of the bit line 110 [1] is disposed between the line width expanding regions 111 of the even-numbered bit split lines 110 [0]-2 and 110 [2]-2, whereby the pitch of the bit lines is minimized.

The wide spacing regions 107A of the control gate lines are disposed in the line width expanding regions 111 of the even-numbered bit split lines 110 [0]-2 and 110 [2]-2. Since the width between the two wide spacing regions 107A is small, the common connection region 107B of the control gate lines 106B and 106A is disposed in this narrow region. This enables the space to be secured between the adjacent control gate lines.

In the first wiring-only region 211A, the discontinuous region 107E of the even-numbered bit line is formed between the line width expanding regions 107A of the odd-numbered bit split lines. The common connection region 107B of two control gate lines 106B and 106A is formed in this region.

The present invention is not limited to the above-described embodiment. Various modifications and variations are possible without departing from the spirit and scope of the present invention.

For example, the structure of the nonvolatile memory elements 108A and 108B is not limited to the MONOS structure. The present invention can be applied to a nonvolatile semiconductor memory device using various types of other memory cells capable of independently trapping charges at two sites by one word gate 104 and two control gates 106A and 106B.

In FIG. 10, the respective even-numbered and odd-numbered sub bit lines BL alternately extend in the opposite directions. However, the extending direction may be the same. In this case, the sub bit select circuits 216 and 218 are formed in either the first select region 220 or the second select region 222, and the sub control gate select circuits 212 and 214 are formed in the other.

What is claimed is:

1. A nonvolatile semiconductor memory device comprising:
    a memory cell array region in which a plurality of memory cells are arranged in first and second directions intersecting each other, each of the memory cells having two nonvolatile memory elements and being controlled by one word gate and two control gates; and
    wherein the memory cell array region includes:
        a plurality of control gate lines formed by connecting, in the first direction, each of the control gates of the memory cells in each column arranged in the first direction; and
        sub-control gate lines extending in the first direction in an upper layer of the control gate lines, the number of the sub-control gate lines being half the number of the control gate lines, and
    wherein each two control gate lines adjacent across the boundaries between the memory cells arranged in the second direction are connected in common with one sub-control gate line.

2. The nonvolatile semiconductor memory device as defined in claim 1, further comprising:
    a select region disposed adjacent to the memory cell array region in the first direction; and
    a plurality of main control gate lines extending in the first direction within the select region and the memory cell array region, the number of the main control gate lines being smaller than the number of the sub-control gate lines,
    wherein the select region has at least one sub-control gate select circuit which selectively connects the sub-control gate lines with the main control gate lines.

3. The nonvolatile semiconductor memory device as defined in claim 2,
    wherein the select region includes first and second select regions disposed on both sides of the memory cell array region in the first direction,
    wherein the first select region has a first sub-control gate select circuit which selectively connects one of an odd-numbered sub-control gate line and an even-numbered sub-control gate line with the main control gate lines, and
    wherein the second select region has a second sub-control gate select circuit which selectively connects the other one of the odd-numbered sub-control gate line and the even-numbered sub-control gate line with the main control gate lines.

4. The nonvolatile semiconductor memory device as defined in claim 1,
    wherein each of the two nonvolatile memory elements has an ONO film consisting of an oxide film (O), nitride film (N), and oxide film (O) as a charge trap site.

5. A nonvolatile semiconductor memory device comprising:
    a memory cell array region in which a plurality of memory cells are arranged in first and second directions intersecting each other, each of the memory cells having two nonvolatile memory elements and being controlled by one word gate and two control gates, and
    wherein the memory cell array region comprises:
        a plurality of bit lines formed of impurity layers extending in the first direction, the bit lines are disposed on both sides of the memory cells arranged in the first direction;
        a plurality of control gate lines formed by connecting, in the first direction, each of the control gates of the memory cells in each column arranged in the first direction, the number of control gate lines being twice the number of the bit lines;
        sub-control gate lines extending in the first direction in an upper layer of the plurality of control gate lines, the number of sub-control gate lines being the same as the number of the bit lines; and
        a plurality of word lines extending in the second direction, wherein each two control gate lines adjacent across the boundaries between the memory cells arranged in the second direction are connected in common with one sub-control gate line.

6. The nonvolatile semiconductor memory device as defined in claim 5, wherein each two control gate lines, disposed on both sides of an even-numbered bit lines, are connected in common with an even-numbered sub-control gate lines, and wherein each two control gate lines, disposed on both sides of an odd-numbered bit line, are connected in common with an odd-numbered sub-control gate line.

7. The nonvolatile semiconductor memory device as defined in claim 6, wherein each of the bit lines has a plurality of bit split lines divided by a discontinuous region in the first direction, and wherein a plurality of sub-bit lines connected respectively with the plurality of bit split lines which form one bit line extend in the first direction in an upper layer of the bit lines.

8. The nonvolatile semiconductor memory device as defined in claim 7, further comprising:

first and second select regions formed on both sides of the memory cell array region in the first direction;

a plurality of main control gate lines extending in the first direction within the first and second select regions and the memory cell array region, the number of the main control gate lines being smaller than the number of the sub-control gate lines; and a plurality of main bit lines extending in the first direction within the first and second select regions and the memory cell array region, the number of the main bit lines being smaller than the number of the sub-bit lines, wherein the first select region comprises:
a first sub-bit select circuit which selectively connects one of the even-numbered sub-bit line and the odd-numbered sub-bit line with the main bit lines; and
a first sub-control gate select circuit which selectively connects one of the even-numbered sub-control gate line and the odd-numbered sub-control gate line with the main control gate lines, and wherein the second select region comprises:
a second sub-bit select circuit which selectively connects the other one of the even-numbered sub-bit line and the odd-numbered sub-bit line with the main bit lines; and
a second sub-control gate select circuit which selectively connects the other one of the even-numbered sub-control gate line and the odd-numbered sub-control gate line with the main control gate lines.

9. The nonvolatile semiconductor memory device as defined in claim 8, wherein the plurality of sub-bit lines form a first metal interconnect layer.

10. The nonvolatile semiconductor memory device as defined in claim 9, wherein the plurality of sub-control gate lines form a second metal interconnect layer.

11. The nonvolatile semiconductor memory device as defined in claim 10, wherein the plurality of main bit lines and the plurality of main control gate lines form a third metal interconnect layer.

12. The nonvolatile semiconductor memory device as defined in claim 8, wherein a plurality of memory blocks each of which is formed of the memory cell array region and the first and second select regions provided on both sides of the memory cell array region are arranged in the first direction.

13. The nonvolatile semiconductor memory device as defined in claim 12, wherein a main bit line driver which drives the plurality of main bit lines is provided on one end of the arranged memory blocks in the first direction, and wherein a main control gate line driver which drives the plurality of main control gate lines is provided on the other end of the arranged memory blocks in the first direction.

14. The nonvolatile semiconductor memory device as defined in claim 12, wherein a word line driver which drives the word lines is provided on one end of the arranged memory blocks in the second direction.

15. The nonvolatile semiconductor memory device as defined in claim 14, wherein the plurality of memory blocks is disposed on both sides of the word line driver in the second direction.

16. The nonvolatile semiconductor memory device as defined in claim 5, wherein each of the two nonvolatile memory elements has an ONO film consisting of an oxide film (O), nitride film (N), and oxide film (O) as a charge trap site.

* * * * *